June 29, 1965 R. L. WATTERS 3,192,485

TUNNEL DIODE FREQUENCY CONTROLLED OSCILLATOR

Filed Aug. 22, 1962

Inventor:
Robert L. Watters,
by [signature]
His Attorney.

United States Patent Office 3,192,485

Patented June 29, 1965

3,192,485

TUNNEL DIODE FREQUENCY CONTROLLED OSCILLATOR

Robert L. Watters, Schenectady, N.Y., assignor to General Electric Company, a corporation of New York Filed Aug. 22, 1962, Ser. No. 218,649
11 Claims. (Cl. 331—107)

This invention relates to a tunnel diode frequency controlled oscillator and also to such an oscillator including temperature compensating means. This is a continuation-in-part of application Serial No. 858,996, filed December 11, 1959, and now abandoned.

The device used by this invention exhibits a region of strong negative resistance in the forward low voltage portion of its current-voltage characteristic and is well-known in the art as a tunnel diode.

For further details concerning the device utilized in this invention, reference may be had to the booklet entitled "Tunnel Diodes" published November 1959 by Research Information Services, General Electric Company, Schenectady, New York, and also to the copending application of Jerome J. Tiemann, Serial No. 74,815, filed December 9, 1960, which is a continuation-in-part of application Serial No. 858,995, filed December 11, 1959, and now abandoned. Both of such applications are assigned to the assignee of the present invention.

It is an object of this invention to provide a new and improved frequency controlled oscillator.

It is another object of this invention to provide a frequency controlled oscillator which is simpler and more efficient than prior systems and which is temperature compensated.

It is a further object of this invention to provide a new and improved oscillator circuit whose frequency can be made to vary in a predetermined manner with temperature.

Briefly stated, in accord with one aspect of my invention a tunnel drive device is utilized as the active element in a frequency controlled oscillator. A bridge-type network, which includes a piezoelectric crystal, provides a high impedance across the tunnel diode only near the selected series resonant mode of the crystal. The circuit, therefore, oscillates at a frequency controlled by the selected series resonant mode of the crystal and at that frequency only.

In accordance with another feature of this invention, I make the resonant frequency defined by the relationship $$\frac{1}{2\pi\sqrt{LC}}$$

of the inductance and capacitance of the bridge-type network different than the selected series resonant frequency of the piezoelectric crystal so that the series resistance of the crystal itself, or of the circuit branch in which the crystal is connected, affects the oscillator frequency in a predetermined manner.

The novel features believed characteristic of this invention are set forth with particularity in the appended claims. The invention itself, however, both as to its organization and method of operation, together with further objects and advantages thereof, may best be understood by reference to the following description taken in connection with the accompanying drawing in which:

This invention utilizes the negative resistance characteristic of the tunnel diode device in circuit combination with a frequency determining network which includes a piezoelectric crystal. The network presents the highest impedance across the tunnel diode device only near the selected series resonant frequency of the piezoelectric crystal. The resulting circuit arrangement provides an extremely stable oscillator.

Figure 1:
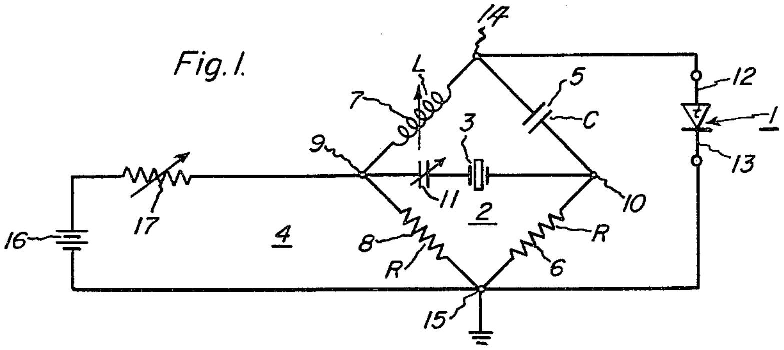
FIGURE 1 is a schematic illustration of one embodiment of the invention.

FIGURE 1 shows a schematic circuit diagram of a frequency control oscillator having the features and arrangement of this invention. As shown the oscillator comprises a single tunnel diode device 1, a frequency determining network 2 including a piezoelectric crystal 3 and a bias circuit means 4.

Frequency determining network 2 is a bridge circuit having two currents paths. One current path is through the capacitance 5 and the resistance 6. The other current path is through the inductance 7 and resistance 8. A crystal branch, including piezoelectric crystal 3, is connected between the junctions 9 and 10 of the capacitance-resistance and inductance-resistance combinations, respectively. A variable load capacitance 11 in series with piezoelectric crystal 3 may also be provided in the crystal branch to obtain a fine adjustment of the series resonant frequency of the crystal. The value of such a load capacitance together with the characteristics of the piezoelectric crystal is always available for any precision crystal.

Resistances 6 and 8 are preferably selected to be of substantially equal value. In addition, this value should be less than the absolute value of the negative resistance of the tunnel diode 1. For a wide variety of uses, it is also preferable that, in addition to being less than the absolute value of the negative resistance of the tunnel diode, resistances 6 and 8 be made to have a value equal to $\sqrt{L/C}$ where L equals the value of inductance 7 in henries and C equals the value of capacitance 5 in farads. With this value of resistance the network, without the crystal, is one of constant resistance.

Terminals 12 and 13 of tunnel diode device 1 are connected respectively to the junctions 14 and 15 of the network 2. A voltage source, shown schematically as battery 16, has one terminal connected to the junction 15 and the other terminal connected through a resistance 17 to the junction 9. Battery 16, resistance 17 and resistance 8 comprises the bias means 4 for tunnel diode device 1.

When the bias connection, shown specifically in FIGURE 1 is utilized, it will be understood that the effective value of resistance 8 of network 2 is that due to the parallel combination of resistances 8 and 17, so that, when the resistances of the network are to be made equal, the value of resistance 6 should be made equal to this effective value rather than equal to the value of resistance 8 alone. Since the value of resistance 17, however, is usually large compared to the value of resistance 8, this equivalent value is substantially the same as that of resistance 8 alone so that in most instances this would not be a seriously critical practical consideration.

Figure 2:
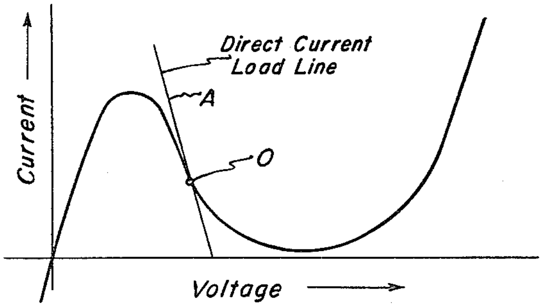
FIGURE 2 illustrates the typical characteristic curve of the semiconductor tunnel diode device utilized in this invention; and, FIGURE 3 shows the operation of the temperature compensating means in accordance with a preferred embodiment of the frequency controlled oscillator of this invention.

The values of voltage source 16, resistance 17 and resistance 8 are selected so that the direct current load line established thereby intersects the tunnel diode current voltage characteristics only in the negative resistance region thereof. A typical suitable direct current load line to provide such operation for the tunnel diode device is shown at A in FIGURE 2. As shown, the load line A intersects the tunnel diode current voltage characteristic at the point O in the negative resistance region.

In the circuit arrangement of this invention the piezoelectric crystal 3 operates in its low impedance or series resonant mode. Although a piezoelectric crystal is preferred as a frequency stabilizing element other series resonant frequency determining elements or devices may be employed such as means employing a tuning fork, a magnetorestrictive wire or other mechanical or electromechanical means. I prefer to employ a piezoelectric crystal, however, since the resonance curve of such a device is extremely sharp. Piezoelectric crystals oscillate only over a very narrow frequency range and are particularly suitable for oscillator frequency control. In addition, quartz crystals, for example, are mechanically rigid, inexpensive and can exhibit a small temperature coefficient.

In one embodiment of this invention, the values of inductance 7 and capacitance 5 are selected to provide a parallel resonant circuit at the selected series resonant mode. For example, the relationship $$\frac{1}{2\pi\sqrt{LC}}$$

is made to equal the selected series resonant frequency of the crystal.

For another embodiment, however, I have discovered that when the relationship $$\frac{1}{2\pi\sqrt{LC}}$$

is made different than the selected series resonant frequency of the piezoelectric crystal then the frequency of the oscillator circuit is effected by the series resistance of the crystal branch of network 2. If the crystal branch includes only the piezoelectric crystal 3 then the series resistance of the crystal itself is utilized to effect the oscillator frequency in a predetermined manner. If a load capacitance 11 is included in the crystal branch then the series resistance of the entire crystal branch, including the crystal and the load capacitance, effects the oscillator frequency.

Since the series resistance of the piezoelectric crystal increases with increase in temperature, this relationship may be utilized to provide for temperature compensation of the oscillator. For any precision crystal the temperature frequency characteristic thereof will be known so that the relationship $$\frac{1}{2\pi\sqrt{LC}}$$

may be made either higher or lower than the selected series resonant frequency of the crystal to provide the required temperature compensation.

For example, when the relationship $$\frac{1}{2\pi\sqrt{LC}}$$

is made higher than the selected series resonant frequency of piezoelectric crystal 3, the oscillator frequency increases with increase in the series resistance of the crystal branch. Similarly, when the relationship $$\frac{1}{2\pi\sqrt{LC}}$$

is made lower than the selected series resonant frequency of piezoelectric crystal 3, the oscillator frequency decreases with increase in the series resistance of the crystal branch.

Figure 3:
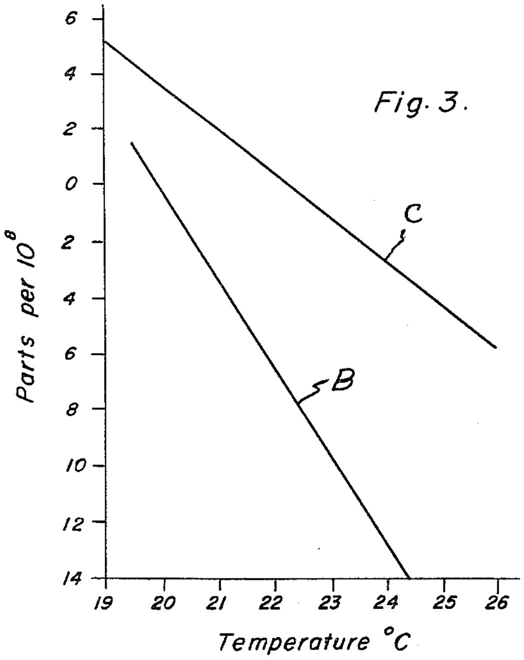

FIGURE 3 illustrates the effect of such temperature compensation on an oscillator circuit utilizing a particular GT cut crystal. The curve B shows the change in frequency with temperature for an oscillator constructed in accordance with the first described embodiment of this invention wherein the relationship $$\frac{1}{2\pi\sqrt{LC}}$$

equals the selected series resonant frequency of the crystal and where the series resistance of the crystal branch has essentially no effect on the frequency. Since, as shown, this oscillator is extremely stable, the change in the frequency is very small and is due to the change in the series resonant frequency of the crystal itself with temperature. Curve C of FIGURE 3 shows the significantly lesser change in frequency when the relationship $$\frac{1}{2\pi\sqrt{LC}}$$

is made different than the selected series resonant frequency of the crystal so that the circuit operates with a temperature compensating means due to the effect of the series resistance of the crystal branch on the frequency.

As shown by curve B in FIGURE 3 the frequency changed about 3.2 parts in $10^8$ per degree centigrade illustrating the extreme stability of the oscillator of this invention. Curve C on the other hand, due to the temperature compensation effect, shows a frequency change of only 1.6 parts in $10^8$ per degree centigrade.

The results shown in FIGURE 3 are not intended to represent the optimum temperature compensation possible for the oscillator circuit of this invention. It is to be understood, therefore, that, with the use of precision piezoelectric crystals, initially, full temperature compensation can be approached.

To simplify the explanation of the operation of the oscillator of this invention assume, initially, that the circuit of FIGURE 1 is considered without the piezoelectric crystal connected between the junctions 9 and 10 of network 2. Tunnel diode device 1 is biased, such as by a direct current load line similar to that shown at A in FIGURE 2, for operation in its negative resistance region. With resistances 6 and 8 of equal value and substantially equal to $\sqrt{L/C}$ a constant resistance is presented across the tunnel diode at all frequencies. Since this resistance has been made less than the absolute magnitude of the negative resistance of the tunnel diode no oscillations will be produced. For example, at any frequency the increase in impedance due to inductance 7 is compensated by the decrease in impedance due to capacitance 5 so that the constant resistance R is presented across the tunnel diode device.

With piezoelectric crystal 3 connected between the junctions 9 and 10 as shown in FIGURE 1, however, the network presents a high impedance to the tunnel diode near the series resonant frequency of the crystal. When the relationship $$\frac{1}{2\pi\sqrt{LC}}$$

of the inductance-capacitance combination is made the same as the selected series resonant frequency of the piezoelectric crystal branch, the network presents this high impedance at the series resonant frequency of the crystal branch and the series resistance thereof has essentially no effect thereon.

When the relationship $$\frac{1}{2\pi\sqrt{LC}}$$

is made to be different than the selected series resonant frequency of the piezoelectric crystal branch, however, the output frequency of the oscillator is still controlled by the series resonant frequency thereof but can be changed in a predetermined manner by a change in the series resistance of the piezoelectrical crystal or a change in the total series resistance of the branch in which the crystal is connected. Since temperature causes a change in the series resistance of the crystal this effect may be utilized to compensate for the characteristic change in the series resonant frequency of the crystal with temperature to provide an oscillator having an extremely constant frequency output.

To illustrate the operation of the piezoelectric crystal frequency control more clearly, refer again to FIGURE 1 and assume that piezoelectric crystal 3 is at its series resonant frequency and, therefore, is essentially a short circuit. The impedance connected across the tunnel diode is then the parallel resonant impedance of the combination of inductance 7 and capacitance 5 plus $R/2$, where R is the value of resistances 6 or 8 since these resistances have equal values. When this impedance is made greater than the absolute magnitude of the tunnel diode negative resistance the circuit produces oscillations.

From the foregoing description, it has been shown that the frequency where the network exhibits its highest impedance is near the selected series resonant frequency of the piezoelectric crystal. The circuit produces oscillations, therefore, at that frequency only and provides a simple oscillator producing an extremely constant frequency. Further, by suitable selection of the relationship $$\frac{1}{2\pi\sqrt{LC}}$$

with respect to the series resonant frequency of the crystal, the controlled output frequency may be made to depend in a predetermined manner on the series resistance of the crystal.

The selected series resonant frequency of the piezoelectric crystal may be either the fundamental or any selected overtone thereof. At higher frequency overtones of the crystal the effects of the crystal holder capacity may become significant. This effect can be conveniently eliminated by shunting the crystal with a suitable inductance.

It has been found that the frequency of the oscillator circuit of this invention is limited only by the frequency limitation of the crystal or other series resonant device utilized since the tunnel diode device utilized herein is capable of operation into the superhigh frequency range.

A frequency controlled oscillator circuit having the features of this invention utilized the following circuit parameters which are given by way of example only and are not intended as limiting this invention:

Tunnel diode 1=0.5 milliampere peak current germanium tunnel diode
Piezoelectric crystal 3=100 kilocycle GT—cut quartz crystal, Northern Engineering Company, type T–12G
Capacitance 5=8000 micromicrofarads
Resistances 6 and 8=200 ohms
Inductance 7=300–500 microhenries (variable)
Capacitance 11=approximately 100 micromicrofarads (variable)
Battery 16=1.5 volts
Resistance 17=5000 ohms Inductance 7 was adjusted to approximately 320 microhenries so that the relationship $$\frac{1}{2\pi\sqrt{LC}}$$

was equal to 100 kilocycles which was the series resonant frequency of the crystal. Capacitance 11 was then adjusted to obtain an output frequency from the oscillator of 100 kilocycles which was controlled by crystal 3. The change in frequency of this oscillator with temperature in parts per $10^8$ is shown by the curve B in FIGURE 3.

The other embodiment of this invention was then constructed, utilizing the same circuit parameters except that the 8000 micro microfarad capacitance 5 was replaced with one of 6050 micromicrofarads so that the relationship $$\frac{1}{1\pi\sqrt{LC}}$$

of the inductance-capacitance combination was approximately 110 kilocycles instead of the 100 kilocycles, as before. For example, this relationship was made higher in frequency than the selected series resonant frequency (100 kc.) of the crystal. Capacitance 11 was adjusted to again produce an output of 100 kilocycles. The change in frequency of this oscillator with temperature is shown by the curve C in FIGURE 3.

In a similar circuit with capacitance 5 increased to about 9000 micromicrofarads so that the relationship $$\frac{1}{2\pi\sqrt{LC}}$$

was lower than the series resonant frequency of the crystal the frequency of the oscillator decreased with increase in the series resistance of the crystal branch. Similarly, with the capacitance 5 at a value of about 7600 micromicrofarads so that the relationship $$\frac{1}{2\pi\sqrt{LC}}$$

was higher than the series resonant frequency of the crystal, the frequency increased with increase in series resistance of the crystal branch.

The crystal controlled frequency of this oscillator circuit, therefore, may be made to vary in a predetermined manner with change in the series resistance of the crystal itself, such as is produced with a change in temperature for example. Since it is believed that crystal ageing may cause a change in the series resistance of the crystal compensation may be provided by this invention for the effects of crystal ageing as well as the effects of temperature.

While only certain preferred features and embodiments of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent of the United States is:

1. A frequency controlled oscillator comprising: a tunnel diode device means coupled to said tunnel diode device and establishing operation therefor in its negative resistance region; a bridge network connected across said tunnel diode device, said network having one current path including a capacitance equivalent to "(C)" farads and a resistance and another current path including an inductance equivalent to "(L)" henries and a resistance, each of said resistances having a value less than the absolute magnitude of the tunnel diode negative resistance; and a series resonant element connected within said bridge network between the junctions of said inductance resistance and capacitance resistance respectively, the values of said inductance and capacitance of said network being selected to provide that the frequency relationship $$\frac{1}{2\pi\sqrt{LC}}$$

is different from the selected series resonant frequency of said element so that said oscillator output frequency is controlled by the series resonant frequency of said series resonant element and is effected in a predetermined manner by the series resistance thereof.

2. A frequency controlled oscillator comprising: a tunnel diode device; bias means coupled to said tunnel diode device and establishing operation therefor in its negative resistance region; a bridge network connected across said tunnel diode device, said network having one current path including a capacitance equivalent to "(C)" farads and a resistance and another current path including an inductance equivalent to "(L)" henries and a resistance, each of said resistances having a value less than the absolute magnitude of the tunnel diode negative resistance; and a piezoelectric crystal connected within said bridge network between the junctions of said inductance resistance and capacitance resistance respectively, the values of said inductance and capacitance being selected to provide that the frequency relationship $$\frac{1}{2\pi\sqrt{LC}}$$

is different from the selected series resonant frequency of said crystal so that said oscillator frequency is controlled by the series resonant frequency of said crytsal and is effected in a predetermined manner by the series resistance thereof.

3. The frequency controlled oscillator of claim 2 wherein the relationship $$\frac{1}{2\pi\sqrt{LC}}$$

is made higher than the selected series resonant frequency of said crystal so that an increase in the series resistance of said crystal causes an increase in the output frequency of said oscillator.

4. The frequency controlled oscillator of claim 2 wherein the relationship $$\frac{1}{2\pi\sqrt{LC}}$$

is made lower than the selected series resonant frequency of said crystal so that an increase in the series resistance of said crystal causes a decrease in the output frequency of said oscillator.

5. The frequency controlled oscillator of claim 2 wherein each of said resistances are equal to $\sqrt{L/C}$.

6. A frequency controlled oscillator comprising: a tunnel diode device; bias means coupled to said tunnel diode device and establishing operation therefor in its negative resistance region; a bridge network connected across said tunnel diode device and having one current path including a capacitance equivalent to "(C)" farads and a resistance and another current path including an inductance equivalent to "(L)" henries and a resistance, said resistances each being less than the absolute magnitude of the tunnel diode negative resistance; a series resonant element connected within said network between the junctions of said inductance resistance and capacitance resistance combinations respectively, the values of said inductance and capacitance being selected to provide that the frequency relationship $$\frac{1}{2\pi\sqrt{LC}}$$

is equal to the selected series resonant frequency of said series resonant element so that the highest impedance of said network is near the selected series resonant frequency of said crystal to cause oscillations to be produced by said circuit which are controlled by the series resonant frequency of said series resonant element.

7. A frequency controlled oscillator comprising: a tunnel diode device; bias means coupled to said tunnel diode device and establishing operation therefor in its negative resistance region; a bridge network connected across said tunnel diode device, said network having one current path including a capacitance equivalent to "(C)" farads and a resistance and another current path including an inductance equivalent to "(L)" henries and a resistance, each of said resistances having a value less than the absolute value of the tunnel diode negative resistance; and a piezoelectric crystal including means in series therewith for controlling the series resonant frequency thereof connected within said bridge network and forming a crystal branch thereof between the junctions of said capacitance-resistance and inductance-resistance combinations respectively, the values of said inductance and capacitance being selected to provide that the frequency relationship $$\frac{1}{2\pi\sqrt{LC}}$$

differs from the selected series resonant frequency of said piezoelectric crystal so that said oscillator output frequency is controlled by the series resonant frequency of said crystal and is effected in a predetermined manner by the series resistance of said crystal branch of said network.

8. The frequency controlled oscillator of claim 7 wherein the relationship $$\frac{1}{2\pi\sqrt{LC}}$$

is made higher than the selected series resonant frequency of the crystal so that an increase in the series resistance of the crystal branch of said network results in an increase in the output frequency of said oscillator.

9. The frequency controlled oscillator of claim 7 wherein the relationship $$\frac{1}{2\pi\sqrt{LC}}$$

is made lower than the selected series resonant frequency of said crystal so that an increase in the series resistance of the crystal branch of said network results in a decrease in the output frequency of said oscillator.

10. The frequency controlled oscillator of claim 7 wherein each of said resistances has a value equal to $\sqrt{L/C}$.

11. A frequency controlled oscillator comprising: a tunnel diode device; bias means coupled to said tunnel diode establishing operation therefor in its negative resistance region; a bridge network connected across said tunnel diode device, said network having one current path including a capacitance equivalent to "(C)" farads and a resistance and another current path including an inductance equivalent to "(L)" henries and a resistance, each of said resistances having a value less than the absolute value of the tunnel diode negative resistance; and a piezoelectric crystal including a load capacitance in series therewith for controlling the series resonant frequency thereof connected within said bridge network and forming a crystal branch between the junctions of said inductance-resistance and capacitance-resistance combinations respectively, the values of said inductance and capacitance being selected to make the frequency relationship $$\frac{1}{2\pi\sqrt{LC}}$$

different than the selected series resonant frequency of said crystal branch so that the crystal controlled output frequency of said oscillator is effected in a predetermined manner by the series resistance of the crystal branch of said network whereby the change in the series resonant frequency of said crystal due to temperature tends to be compensated by the change in frequency of said oscillator due to the change in series resistance of the crystal branch due to temperature.

References Cited by the Examiner

UNITED STATES PATENTS

| | | | |
|---|---|---|---|
| 2,770,731 | 11/56 | Bopp et al. | 331—115 |
| 3,041,552 | 6/62 | Adamthwaite et al. | 331—115 |

ROY LAKE, *Examiner.*